United States Patent
Mahorowala

(10) Patent No.: US 6,849,389 B2
(45) Date of Patent: Feb. 1, 2005

(54) METHOD TO PREVENT PATTERN COLLAPSE IN FEATURES ETCHED IN SULFUR DIOXIDE-CONTAINING PLASMAS

(75) Inventor: Arpan P. Mahorowala, Bronxville, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 09/902,728

(22) Filed: Jul. 12, 2001

(65) Prior Publication Data

US 2003/0017420 A1 Jan. 23, 2003

(51) Int. Cl.[7] .................................................. G03F 7/36
(52) U.S. Cl. .................... 430/317; 430/311; 430/313; 430/314; 430/316; 438/710; 216/67
(58) Field of Search .............................. 430/311, 313, 430/314, 316, 317; 438/710; 216/67; 134/1.2

(56) References Cited

U.S. PATENT DOCUMENTS

| | | | | |
|---|---|---|---|---|
| 4,904,866 A | * | 2/1990 | Collins et al. | 250/492.2 |
| 5,688,719 A | * | 11/1997 | Tsai et al. | 437/194 |
| 5,833,758 A | * | 11/1998 | Linn et al. | 134/1.2 |
| 5,985,524 A | * | 11/1999 | Allen et al. | 430/326 |
| 6,465,159 B1 | * | 10/2002 | Ni et al. | 430/314 |
| 6,528,432 B1 | * | 3/2003 | Ngo et al. | 438/780 |
| 6,562,700 B1 | * | 5/2003 | Gu et al. | 438/477 |
| 2003/0017420 A1 | * | 1/2003 | Mahorowala | 430/313 |
| 2003/0017711 A1 | * | 1/2003 | Mahorowala et al. | 438/719 |

FOREIGN PATENT DOCUMENTS

| | | | | |
|---|---|---|---|---|
| EP | 0 903 777 | * | 3/1999 | H01L/21/302 |
| JP | 2000-200832 | * | 7/2000 | H01L/21/768 |

OTHER PUBLICATIONS

*Pattern Collapse in the Top Surface Imaging Process After Dry Development*; Shigeyasu Mori, et al.; J. Vac. Sci. Technol. B 16(6); pp. 3744–3747 (Nov./Dec. 1998).

* cited by examiner

Primary Examiner—John A. McPherson
Assistant Examiner—Nicole Barreca
(74) Attorney, Agent, or Firm—Connolly Bove Lodge & Hutz LLP; Daniel P. Morris, Esq.

(57) ABSTRACT

Disclosed is an in-situ process that prevents pattern collapse from occurring after they have been etched in S02-containing plasmas. The developed process involving treating the etched wafer to another plasma comprising of a chemically reducing gas such as $H_2$. This treatment chemically reduces the hygroscopic sulfites/sulfates left on the surface after the main etch step. The lower sulfite/sulfate concentration on the wafer translates into considerably less moisture pick up and prevents high aspect ratio feature collapse.

19 Claims, 4 Drawing Sheets

METHOD TO PREVENT PATTERN COLLAPSE IN FEATURES ETCHED IN SULFUR DIOXIDE-CONTAINING PLASMAS

REFERENCES CITED

1 Mori et al., "Pattern collapse in the top surface imaging process after dry development", J. Vac. Sci. Technol. B 16(6), 1998, pp. 3744–3747.

FIELD OF THE INVENTION

The invention relates generally to sub-0.15 micron lithography and particularly, but not by way of limitation, to methods to stabilize high aspect ratio, sub-0.15 micron features against post-etch collapse. The invention also relates generally to devices fabricated using such methods.

BACKGROUND

There is a desire in the industry for higher circuit density in microelectronic devices made using lithographic techniques. One method of achieving higher area density is to improve the resolution of circuit patterns in resist films. It is known in the art that increasing the numerical aperture (NA) of the lens system of the lithographic imaging tool increases the resolution at a given wavelength. However, increasing the NA results in a decrease in the depth of focus (DOF) of the imaging radiation, thereby requiring a reduction in the thickness of the imaging resist film. A decrease in the resist film thickness can lead to problems in subsequent processing steps (e.g., ion implantation and etching).

Bilayer thin film imaging (TFI) has been proposed as one approach to meet both the lithography and the etch resistance requirements for the fabrication of the next generation devices. In bilayer TFI, fine features are first delineated in a thin, usually silicon containing, top layer on a highly absorbing thick organic underlayer. The images thus formed are then transferred down to the underlayer through an anisotropic oxygen-containing reactive ion etching ($O_2$ RIE), during which the silicon in the top layer is converted into nonvolatile silicon oxides, which subsequently functions as an etch mask. In this imaging scheme, the thin top layer improves lithographic resolution and process window (particularly for high numerical aperture (NA) exposure tools), while the thick underlayer affords substrate etch resistance. Bilayer TFI has the potential for enhanced resolution capability, improved process latitude, planarization over topography, and the ability to pattern high aspect ratio resist features for superior substrate etch resistance.

In thin film imaging schemes, patterns are transferred into an organic underlayer using a previously patterned Si-containing layer as the etch-mask. Although $O_2$ is a very effective etching gas, in order to control the critical dimension it is necessary to add a passivating gas to the plasma such as $SO_2$ or $C_2H_4$. The $SO_2$—$O_2$ etch chemistry has been determined to be the most effective for multiple bilayer resist programs.

The $SO_2$—$O_2$ etch is accompanied with the formation of a sulfur-containing passivating film on the feature sidewalls. The sulfite/sulfate species present in the passivating film tend to pick up moisture when the wafers are either rinsed in water or kept in the ambient. (Mori et al., "Pattern collapse in the top surface imaging process after dry development", J. Vac. Sci. Technol. B 16(6), 1998, pp. 3744–3747). As a result, agglomerates may develop on the wafers surface when exposed to atmosphere. As the features get smaller and denser (e.g. 150 nm 1:1 line-and-space patterns and smaller), occasionally line collapse is also observed in high aspect ratio features (AR>8) after the $SO_2$—$O_2$ etch has been performed. Pattern collapse is attributed to the surface tension forces that arise when the sulfuric agglomerates on two neighboring lines swell hygroscopically with time and ultimately combine. Alternatively, the problem of line collapse may be avoided by performing the etch step without exposing the wafer to moisture.

The extent of pattern collapse increases with increasing aspect ratio and depends upon pattern density. It is also dependent on the thin film imaging scheme chosen (e.g. bilayer, CARL) and other factors such as wafer loading and type of structure being etched. Researchers have reported other methods to prevent line-collapse such as heating the wafer or treating the wafer to an $O_2$ (Mori et al.) or $O_2$—He plasma after etch. This also helps reduce or in this specific case eliminates the line-collapse problem. For contact levels, line collapse is not an issue.

If pattern collapse occurs the wafer must be reworked else the affected area will lower the overall process yield. This invention describes an in situ post-etch process that prevents the dense lines from collapsing.

Other objects and advantages will become apparent from the following disclosure.

SUMMARY

A lithographic image is formed and subsequently transferred by an $SO_2$—$O_2$ etch. During the etch sulfates and sulfites are formed on the surfaces of the resist image. These hygroscopic species tend to absorb water from the ambient atmosphere potentially leading to collapse of the image. The present invention provides a means of chemically reducing the sulfates and sulfites to non-hygroscopic sulfur species.

The present invention provides a method to stabilize high aspect ratio, post-etch lithographic images against collapse, the method comprising the steps of: (a) coating a substrate with a substantially organic underlayer; (b) coating said underlayer with a photoresist, wherein said photoresist comprises an element forming a stable, etch-resistant, non-volatile oxide such as silicon, phosphorous, germanium, aluminum, and boron; (c) imagewise exposing said photoresist to radiation; (d) developing an image in said photoresist; (e) transferring said image through said underlayer thus forming a high aspect ratio resist image; and (f) treating said high aspect ratio resist image with a plasma capable of chemically-reducing hygroscopic, oxidized species. A non-limiting example is hydrogen plasma. A further non-limiting example is a species capable of generating hydrogen when excited into a plasma. Such a species is, for example, ethylene.

An aspect of the present invention provides a means of using a stabilized high aspect ratio resist image comprising the steps of: (a) providing a substrate; (b) forming a stabilized bilayer resist image on said substrate; (c) transferring said image into said substrate forming a circuit image; and (d) forming circuit element materials in said circuit image.

An aspect of the invention provides for stabilization of lithographic images formed in trilayer resists. By trilayer resist what is meant is a four-level structure comprising a conventional organic resist, an anti-reflective coating, an inorganic, silicon-containing hard mask, and a thick organic layer.

A further aspect of the present invention provides the semiconductor device fabricated using a chemically stabilized bilayer or trilayer resist image.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

Figure 1A:
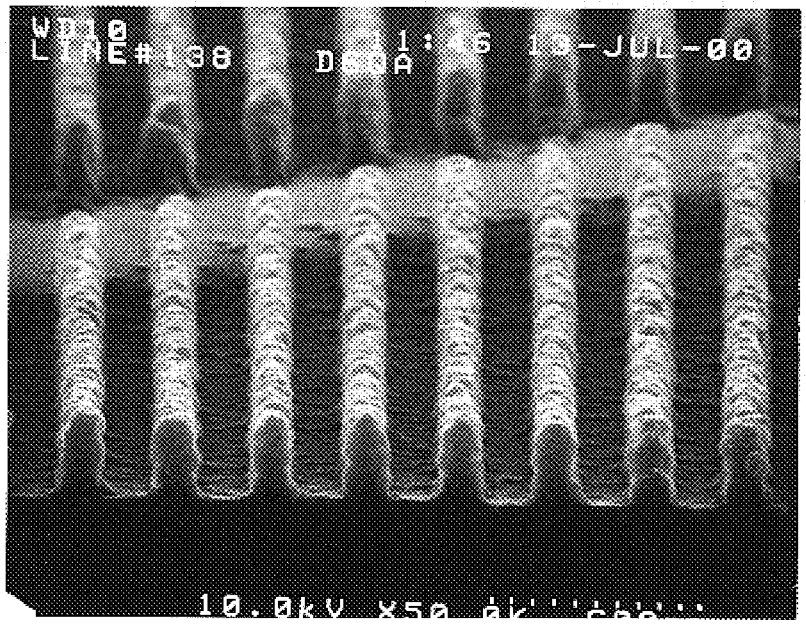
FIG. 1A: High-resolution SEM micrographs of 138 nm lines-and-spaces in the imaging resist after wet development.
Figure 1B:
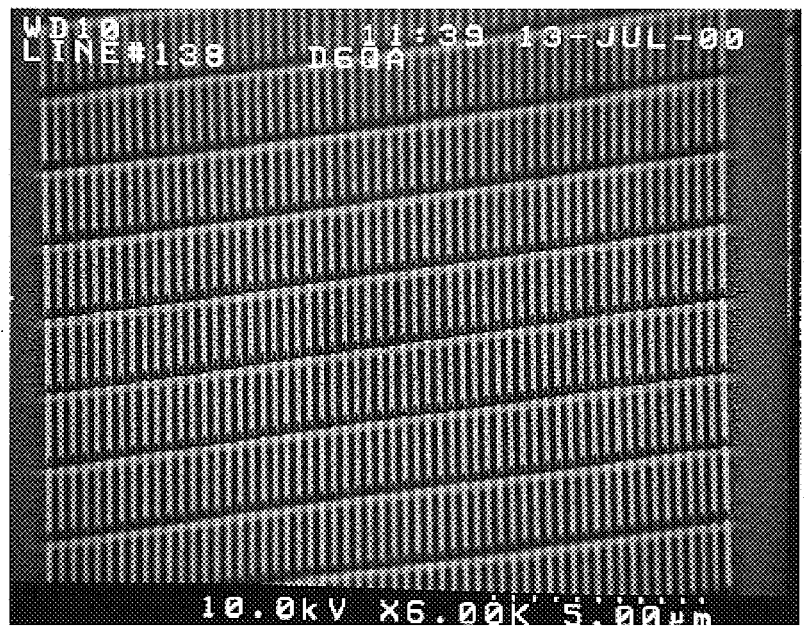
FIG. 1B: Low-resolution SEM micrographs of 138 nm lines-and-spaces as in 1A.

Turning now to FIG. 1. Photolithography was used to define 138 nm line-and-space structures into a 250 nanometer layer yielding a final aspect ratio of about 2. At such low aspect ratios line collapse is not commonly observed. The integrity of the lines was confirmed by SEM. Pattern collapse is commonly observed when the aspect ratio of the features exceeds 3.5.

Figure 2A:
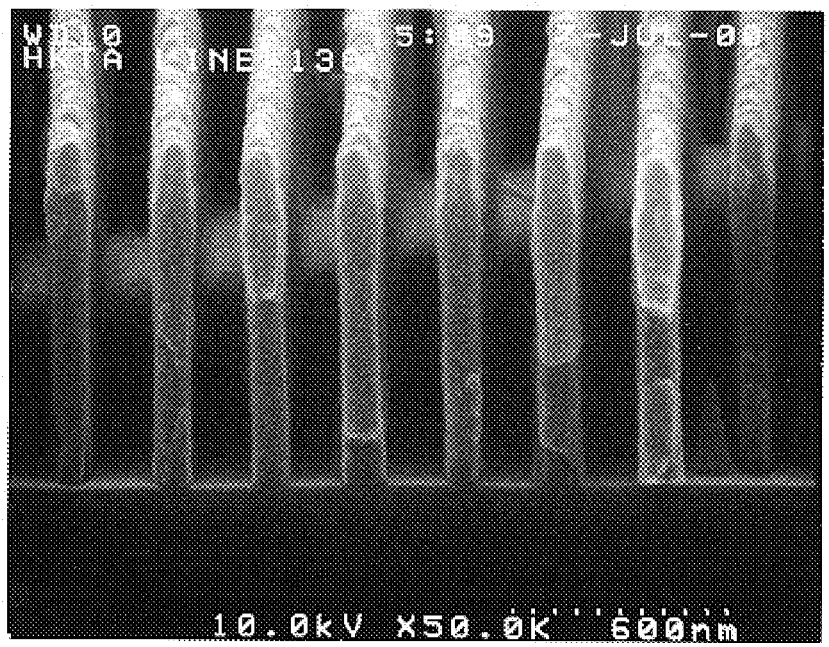
FIG. 2A: High-resolution SEM micrographs of 138 nn lines-and-spaces transferred into the underlayer with an $SO_2$—$O_2$ plasma etch following 7-day exposure to ambient.
Figure 2B:
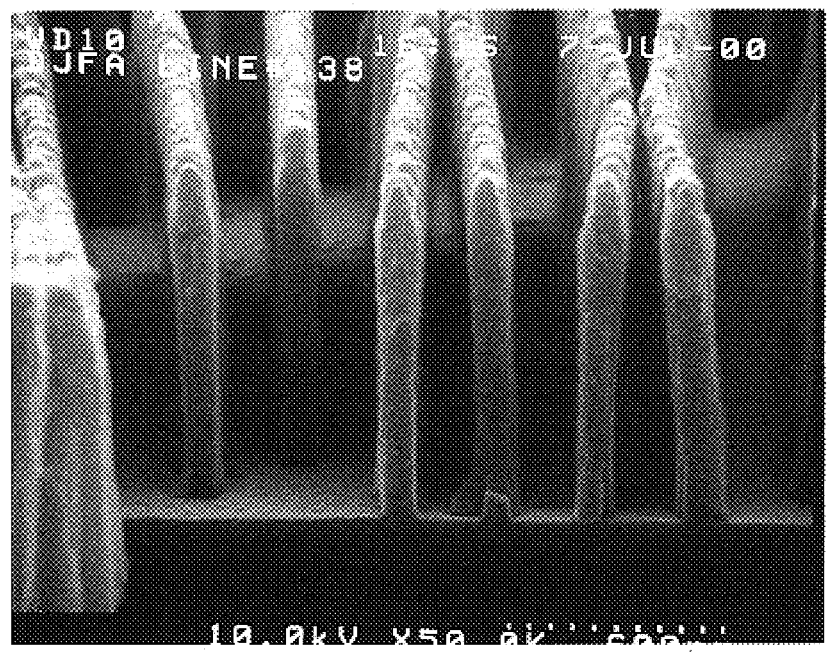
FIG. 2B: Low-resolution SEM micrographs of 138 nn lines-and-spaces transferred into the underlayer with an $SO_2$—$O_2$ plasma etch following 7-day exposure to ambient.

Turning now to FIG. 2. 138 nm line-and-space patterns were lithographically patterned in a 250 nm thick silicon-containing imaging resist and then transferred into a 800 nn organic underlayer. These two layers, when combined, are known as "bilayer resist". After the etch the feature aspect ratio exceeds 7 which is twice what is possible with conventional single layer resist processes. The main etch was performed using $SO_2$—$O_2$ chemistry on a high-density plasma etch tool.

The addition of $SO_2$ to the plasma is essential to control the rate of etch and to preserve the high-fidelity of the pattern transferred into the underlayer. However, this chemistry generates sulfite and sulfate species on the feature sidewalls. These species are hygroscopic in nature and tend to pick up moisture from the atmosphere forming agglomerates. Agglomerates on neighboring lines coalesce causing line-collapse. These pictures were taken a week after the etch was performed. A large faction of the lines are observed to have collapsed. A smaller number of lines collapsed when the pictures were taken the same day the etch was performed. The collapse is attributed to the picking up of moisture by the sulfite/sulfate deposits on the etched feature sidewalls and the resultant coalescing of these acidic agglomerates. The absorption of moisture from the ambient is likely to be an uncontrolled process influenced by such variables as the nature and concentration of the sulfur species present, the ambient humidity, and the duration of exposure.

Figure 3:
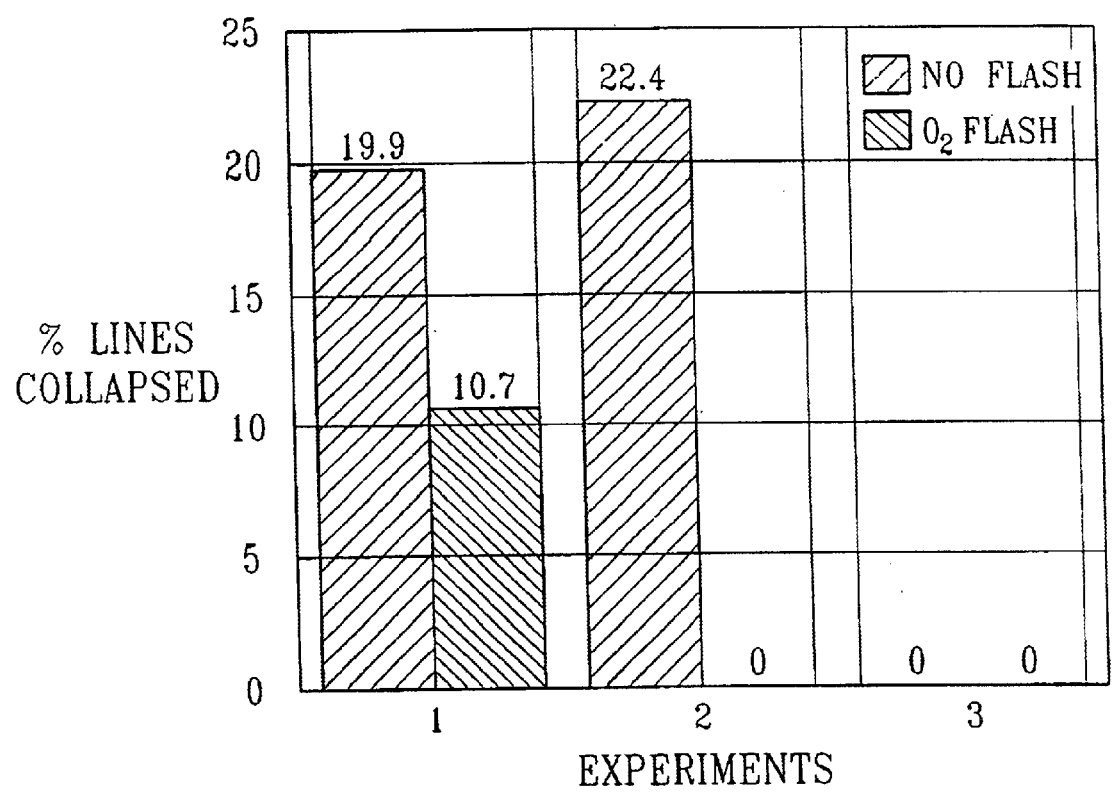
FIG. 3: Reduction of line collapse by $O_2$-flash.

Turning now to FIG. 3. The etch parameters influence the percentage of line collapse observed within one day of etch. In the presence of $SO_2$-containing plasmas, line collapse was observed at low bias power, but was not observed at high bias power. Line collapse was not observed in $O_2$ only plasmas. Increasing the bias power suffices to reduce line collapse, however, that reduction reflects decreased deposition of passivating sulfur species on the feature sidewalls. Oxygen flash decreased the extent of line collapse observed following low bias $SO_2$—$O_2$ etches, but was not robust enough to completely eliminate collapse. Tables I and II describes the etch parameters used to generate FIG. 3.

| Expt | Bias Power (Watts) | $SO_2/O_2$ | % Line Collapse Before | % Line Collapse After |
|---|---|---|---|---|
| 1 | 80 | 20/40 | 19.9 | 10.7 |
| 2 | 150 | 20/40 | 22.4 | 0 |
| 3 | 150 | 0/60 | 0 | 0 |

Figure 4A:
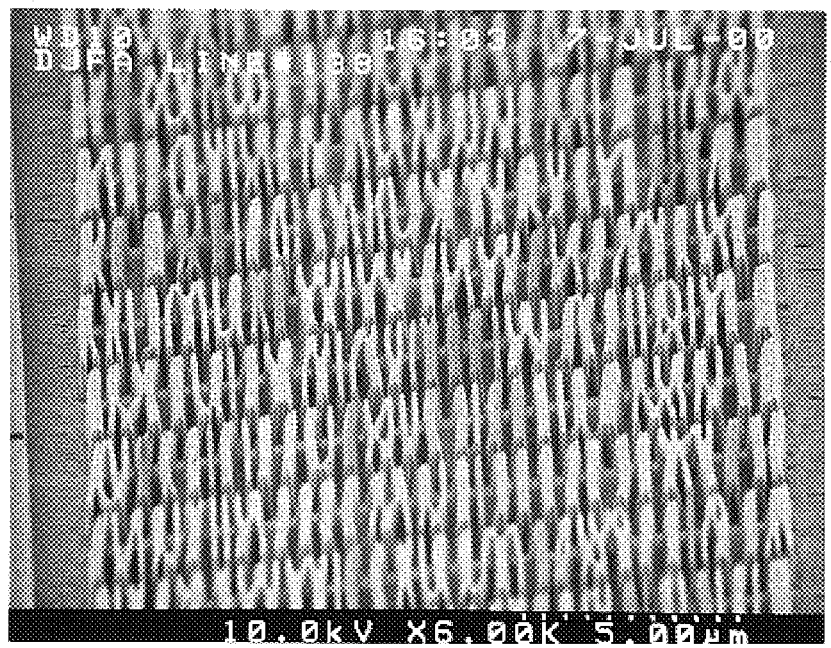
FIG. 4A: SEM micrographs of etched 138 nm lines-and-spaces following $SO_2$—$O_2$ plasma etch; immediate, post-etch $H_2$ plasma treatment; and a 7-day exposure to ambient.
Figure 4B:
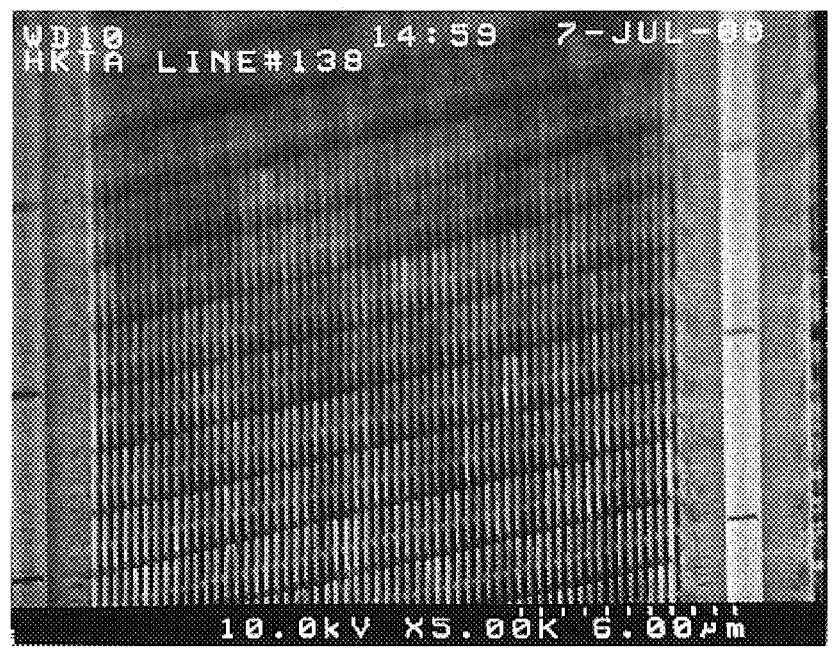
FIG. 4B: Low-resolution SEM micrographs of etched 138 nm lines-and-spaces following $SO_2$—$O_2$ plasma etch; immediate, post-etch $H_2$ plasma treatment; and a 7-day exposure to ambient.

Turning now to FIG. 4. The advantages conferred by the inventive method are confirmed by SEM pictures taken 7 days post treatment. the inventive method provides a means to stabilize high aspect ratio, post-etch lithographic images against collapse, the method comprising the steps of: (a) coating a substrate with an organic underlayer; (b) coating said underlayer with a photoresist wherein said photoresist comprises a stable, etch-resistant, non-volatile oxide-forming material selected from the group consisting of silicon, phosphorous, germanium, aluminum, and boron; (c) imagewise exposing said photoresist to radiation; (d) developing an image in said photoresist; (e) transferring said image through said underlayer into said substrate thus forming a high aspect ratio resist image; and the improvement comprises (f) treating said high aspect ratio resist image with a chemically-reducing plasma. A preferred chemically-reducing plasma comprises a species, such as ethylene, capable of generating hydrogen when excited into the plasma state. A more preferred chemically-reducing plasma comprises hydrogen. No pattern collapse is observed up to a week post treatment indicating that the $H_2$ plasma successfully removed and/or chemically reduced most if not all of the hygroscopic sulfite/sulfate species.

In a preferred embodiment, the underlayer comprises an organic material essentially comprising carbon, hydrogen, and oxygen. In a more preferred embodiment, the underlayer comprises an organic material selected from the group consisting of tuned polymers, novolacs, and low-k dielectrics. Low-k dielectrics refer to semiconductor dielectric resins for example, SiLK® (Dow Chemical Company).

In a preferred embodiment, the photoresist comprises a polymer having acid-cleavable moieties bound thereto, in a preferred embodiment, said photoresist comprises a radiation-sensitive acid generator. In a more preferred embodiment, said photoresist comprises a polymer formed by polymerizing one or more monomers selected from the group consisting of acrylate, methacrylate, hydroxystyrene optionally substituted with $C_{1-6}$-alkyl, $C_{5-20}$ cyclic olefin monomers, and combinations thereof, the polymer having acid-cleavable moieties bound thereto, wherein all such moieties are silylethoxy groups optionally substituted on the ethoxy portion thereof with $C_{1-6}$-alkyl, phenyl, or benzyl.

A method to stabilize high aspect ratio, post-etch lithographic images against collapse, according to claim 1, wherein said radiation comprises electromagnetic radiation or electron beam radiation.

In an embodiment of the invention, the radiation comprises ultraviolet radiation or extreme ultraviolet radiation. In a further embodiment, said radiation comprises x-ray radiation or electron-beam radiation.

In an embodiment of the invention transferring the image further comprises forming a reduced critical dimension bilayer resist image. Such a process is described in co-pending application Ser. No. 09/902,727 which was published as Patent Application Publication Number US 2003/0017711.

The main etch is the step involved in transferring the image developed in the photoresist layer through the underlayer into the substrate thus forming a high aspect ratio resist image. The conditions typically used to perform this operation are given in Table II

TABLE II

| Tool: | Lam TCP 9400SE |
| --- | --- |
| TCP power: | 260 W |
| Bias power: | 80 W |
| Pressure: | 10 mTorr |
| $O_2$ flow: | 40 sccm |
| $SO_2$ flow: | 20 sccm |
| Bottom electrode temp.: | 10 C |
| Duration: | 180 sec. |

The sulfate and sulfite species associated with the passivation layer are removed and/or chemically reduced by the inventive hydrogen plasma flash. The conditions that typically are employed are given in Table III.

TABLE III

| Tool: | Lam TCP 9400SE |
| --- | --- |
| TCP power: | 260 W |
| Bias power: | 0/80 W (Both conditions tried, typically 0 W is used). |
| Pressure: | 10 mTorr |
| $H_2$ flow: | 30 sccm |
| Bottom electrode temp.: | 10 C |
| Duration: | 30 sec. |

The chemically-reducing plasma treatment of the present invention developed is thus shown to be a more robust method of eliminating pattern collapse issues associated with $SO_2$ processing. As the semiconductor device features get smaller and aspect ratios correspondingly larger, this post-etch treatment might be the only way to solve this issue.

An embodiment of the present invention further comprises forming circuit element materials in the circuit image. In an embodiment circuit element materials comprise materials selected from the group consisting of dielectric, conductor, semiconductor, and doped semiconductor materials.

It will, therefore, be appreciated by those skilled in the art having the benefit of this disclosure that this invention provides a method to stabilize high aspect ratio, post-etch lithographic images against collapse. Moreover, it will be realized that another aspect of the invention provides semiconductor devices having high circuit densities. Although the illustrative embodiments of the invention are drawn from the semiconductor arts, the invention is not intrinsically limited to that art.

Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

What is claimed is:

1. A method to stabilize high aspect ratio, post-etch lithographic feature against collapse, the method comprising:

coating a substrate with a substantially organic underlayer;

coating said underlayer with a photoresist comprising materials that form a stable, etch-resistant, non-volatile oxide;

imagewise exposing said photoresist to radiation;

developing an image in said photoresist;

transferring said image through said underlayer into said substrate thus forming a high aspect ratio resist image; and treating said high aspect ratio resist image with a chemically-reducing plasma.

2. The method to stabilize high aspect ratio, post-etch lithographic feature against collapse, according to claim 1, wherein said photoresist comprises an element capable of forming a stable, etch-resistant, non-volatile oxide selected from the group consisting of silicon, phosphorous, germanium, aluminum, and boron.

3. The method to stabilize high aspect ratio, post-etch lithographic images against collapse, according to claim 1, wherein said resist is a bilayer resist comprising:

an organic underlayer formed on said substrate; and a photoresist comprising materials that form a stable, etch-resistant, non-volatile oxide formed on said underlayer.

4. The method to stabilize high aspect ratio, post-etch lithographic images against collapse, according to claim 1, wherein transferring said image comprises etching wherein said etching comprises passivating chemistry.

5. The method to stabilize high aspect ratio, post-etch lithographic images against collapse, according to claim 4, wherein passivating chemistry comprises any process that generates hygroscopic moieties.

6. The method to stabilize high aspect ratio, post-etch lithographic images against collapse, according to claim 4, wherein passivating chemistry comprises an $SO_2$ and $O_2$ containing plasma.

7. The method to stabilize high aspect ratio, post-etch lithographic images against collapse, according to claim 1, wherein said chemically-reducing plasma comprises hydrogen.

8. The method to stabilize high aspect ratio, post-etch lithographic images against collapse, according to claim 1, wherein said chemically-reducing plasma comprises a hydrogen-generating species.

9. The method to stabilize high aspect ratio, post-etch lithographic images against collapse, according to claim 1, wherein said underlayer comprises an organic material selected from the group consisting of tuned polymers, novolacs, and low-k dielectrics.

10. The method to stabilize high aspect ratio, post-etch lithographic images against collapse, according to claim 1, wherein said underlayer comprises an organic material essentially comprising carbon, hydrogen, and oxygen.

11. The method to stabilize high aspect ratio, post-etch lithographic images against collapse, according to claim 1, wherein said photoresist comprises a polymer having acid-cleavable moieties bound thereto.

12. The method to stabilize high aspect ratio, post-etch lithographic images against collapse, according to claim 1, wherein said photoresist comprises a polymer formed by polymerizing one or more monomers selected from the group consisting of acrylate, methacrylate, hydroxystyrene optionally substituted with $C_{1-6}$-alkyl, $C_{2-20}$ cyclic olefin monomers, and combinations thereof, the polymer having acid-cleavable moieties bound thereto, wherein all such moieties are sily lethoxy groups optionally substituted on the ethoxy portion thereof with $C_{1-6}$-alkyl, phenyl, or benzyl.

13. The method to stabilize high aspect ratio, post-etch lithographic images against collapse, according to claim 1, wherein said photoresist comprises a radiation-sensitive acid generator.

14. The method to stabilize high aspect ratio, post-etch lithographic images against collapse, according to claim 1, wherein said radiation comprises electromagnetic radiation or electron beam radiation.

15. The method to stabilize high aspect ratio, post-etch lithographic images against collapse, according to claim 1, wherein said radiation comprises ultraviolet radiation or extreme ultraviolet radiation.

16. The method to stabilize high aspect ratio, post-etch lithographic images against collapse, according to claim 1, wherein said radiation comprises x-ray radiation.

17. The method to stabilize high aspect ratio, post-etch lithographic images against collapse, according to claim 1, wherein transferring said image further comprises forming a reduced critical dimension bilayer resist image.

18. A method of fabricating semiconductor devices using a stabilized, high aspect ratio bilayer resist image comprising:
coating a substrate with an organic underlayer;
coating said underlayer with a photoresist comprising a material that form a stable, etch-resistant, non-volatile oxide;
imagewise exposing said photoresist to radiation;
developing an image in said photoresist;
transferring said image through said underlayer into said substrate thus forming a high aspect ratio resist image;
treating said high aspect ratio resist image with a chemically-reducing plasma;
transferring said image into said substrate forming a circuit image; and
forming circuit element materials in said circuit image.

19. The method of fabricating semiconductor devices using a stabilized, high aspect ration bilayer resist image, according to claim 18, wherein said circuit element materials comprise materials selected from the group consisting of dielectric, conductor, semiconductor, and doped semiconductor materials.

* * * * *